United States Patent [19]

White et al.

[11] Patent Number: 4,574,906

[45] Date of Patent: Mar. 11, 1986

[54] OUTDOOR SPEAKER

[75] Inventors: Jeffrey N. White, Stow; Kenneth R. Reichel, Hudson, both of Ohio

[73] Assignee: Audio Technica U.S., Inc., Stow, Ohio

[21] Appl. No.: 671,590

[22] Filed: Nov. 15, 1984

[51] Int. Cl.[4] .............................................. H05K 5/00

[52] U.S. Cl. .................................. 181/145; 181/146; 181/153; 181/155

[58] Field of Search ................................ 181/144–155, 181/159, 199

[56] References Cited

U.S. PATENT DOCUMENTS

| | | | |
|---|---|---|---|
| 3,326,321 | 6/1967 | Valuch | 181/144 |
| 3,327,808 | 6/1967 | Shaper | 181/153 |
| 3,371,742 | 3/1968 | Norton et al. | 181/153 |
| 3,477,540 | 11/1969 | Rizo-Patron | 181/144 X |
| 3,512,606 | 5/1970 | Anastin | 181/144 |

*Primary Examiner*—Benjamin R. Fuller

*Attorney, Agent, or Firm*—Welsh & Katz, Ltd.

[57] ABSTRACT

A loudspeaker assembly for use outdoors is disclosed. A woofer speaker is secured in a housing for the downward projection of sound through a generally continuous circumferential aperture between the housing and base. A tweeter is mounted coaxially with the woofer for the projection of sound downwardly thereby providing for the omnidirectional projection of sound from the speaker assembly.

7 Claims, 4 Drawing Figures

OUTDOOR SPEAKER

The present invention relates generally to a loudspeaker system and more particularly to a coaxial loudspeaker system for the omnidirectional generation of sound.

A two-way loudspeaker system comprising woofer and tweeter speakers has long been known in the art as a practical solution of the problem of building a transducer array that will cover the full audio frequency range. Further, a coaxial arrangement of the woofer and tweeter speakers where the low frequencies are reproduced by a cone loudspeaker of a diameter in the range of twelve to fifteen inches (woofer) and the high frequencies are reproduced by a small cone or horn transducer (tweeter) mounted in front of the larger cone has been taught by some as providing advantages over a spaced planar woofer-tweeter arrangement. Improved bass response is taught to be possible by inverting the speaker cones and spacing the speaker cone from its base as set forth in U.S. Pat. No. 3,327,808 to Shaper.

Conventional permanent or semipermanent outdoor speakers generally have no housing and are adapted for insertion in an eave for direction of the reproduced sound downwardly. Such a location protects the speaker from damaging water and other outdoor factors. Freestanding speakers for exterior use, with the exception of interior speakers brought outside for use and immediately returned inside after use, are not in general usage because of an inability to stand up to the onslaught of weather, particularly rain.

Accordingly, an object of the subject invention is an outdoor speaker capable of generating omnidirectional sound over a full audio frequency range.

Another object of the subject invention is an outdoor speaker which has a woofer and a tweeter mounted coaxially and inverted for the omnidirectional and accurate reproduction of sound.

These objects are obtained in accordance with the subject invention wherein there is provided an outdoor speaker which includes a moisture impervious, shock resistant plastic housing having mounted within a woofer and a tweeter on a coaxial basis, each speaker being directed downwardly towards the base of the housing. The housing itself is spaced from the base being supported thereon by individual mountings leaving an opening between the housing and the base. Within the housing and above the speakers is sound absorbent material which provides a sound dampening effect for the speakers.

DESCRIPTION OF THE DRAWINGS

Further objects of the invention, together with additional features contributing thereto and advantages accruing therefrom, will be apparent from the following description of one embodiment of the invention when read in conjunction with the accompanying drawings.

Referring now to FIG. 1, there is shown one embodiment of the outdoor speaker of the subject invention 10, having an upper housing portion 11 into which a lower housing portion 13 is seated. A base 15 is secured to the lower housing portion 13 in a manner as will be described. Each of the upper housing portion 11, the lower housing portion 13 and the base 15 is comprised of a electrically non-conductive material with a high impact strength and generally impervious to moisture. While the embodiment of FIG. 1 shows the lower housing portion 13 seated in the upper housing portion 11 and in a generally cylindrically shape, such structure is not necessary to the subject invention and may take various and diverse shapes such as triangular or square in cross-section and may combine the upper and lower portions into one integral piece having a smooth exterior, without changing the nature of the invention therein.

The preferred material of which the housing components 11 and 13 is formed is polyvinyl chloride (PVC), although other plastics of similar properties may also be used for attaining a general resistance to the effects of the weather as well as protection from the weather for the interior components. Upper component 11 may be adhesively secured to the lower component 13 through the use of a suitable PVC cement as is known in the art, thereby forming an impenetrable seal at the joinder of the upper housing component 11 and the lower housing component 13.

Figure 1:
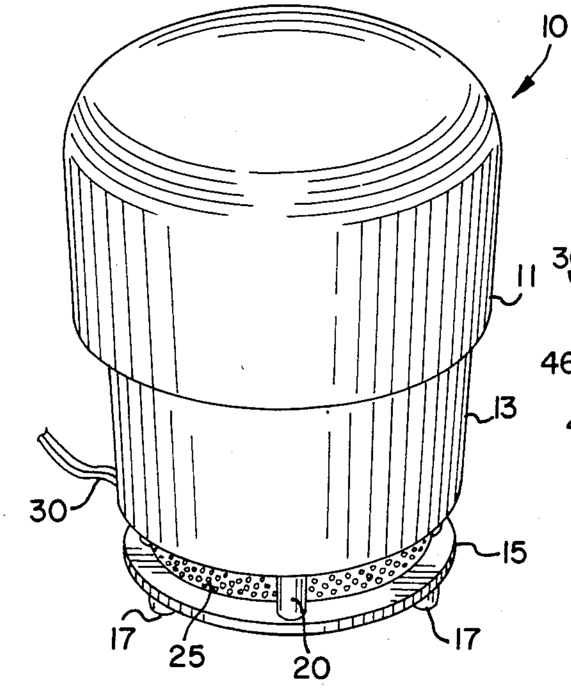
FIG. 1 is a perspective view of one embodiment of the outdoor speaker of the subject invention.

The base 15 is secured to the lower housing component 13 in a spaced manner as best shown in FIG. 1 by three support posts 20 equidistant about the periphery of the base. Each support post 20 may be secured both to the base and to the lower housing 13 by suitable fastening means such as adhesive, self-tapping screws or the like. A number of equally spaced rubber feet 17 are dispersed about the bottom of the base 15 to permit a stable scratch-free support on any relatively smooth surface.

A screen 25 is secured in place to cover the opening between the lower housing portion 13 and the base 15. The screen may take the form of a perforated plastic sheet or it may be screen material formed of a suitable plastic such as PVC or ABS (Acrylonitrile-Butadiene Styrene Copolymer). In any event, the screen material is of an electrically non-conductive material with openings of such a size as not to easily permit the penetration of water to the interior of the speaker. Such restriction of penetration of water need not be absolute as the relatively unhindered passage of sound outwardly through the screen 25 is a necessary function of the subject invention.

Figure 3:
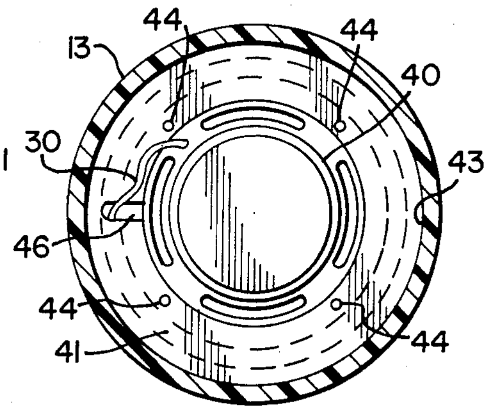
FIG. 3 is a cross-section taken along the lines 3—3 of FIG. 2.

In the interior of the speaker housing 13 within its lower portion and preferably spaced approximately two inches from the base, is an internal flange or shoulder 43 integrally joined to the housing walls. Reducing flange 41 is secured to the inside of the shoulder 43. A midrange or woofer speaker 40 is mounted on this reducing flange 41 for the direction of the sound generated therein in a downwardly direction. As shown in FIG. 3, the speaker 40 is mounted to the reducing flange 41 and secured there by appropriate fastening means 44 such as screws or the like. Slot 46 in reducing flange 41 permits access to the rear of the speaker for connection of wires 30.

Figure 2:
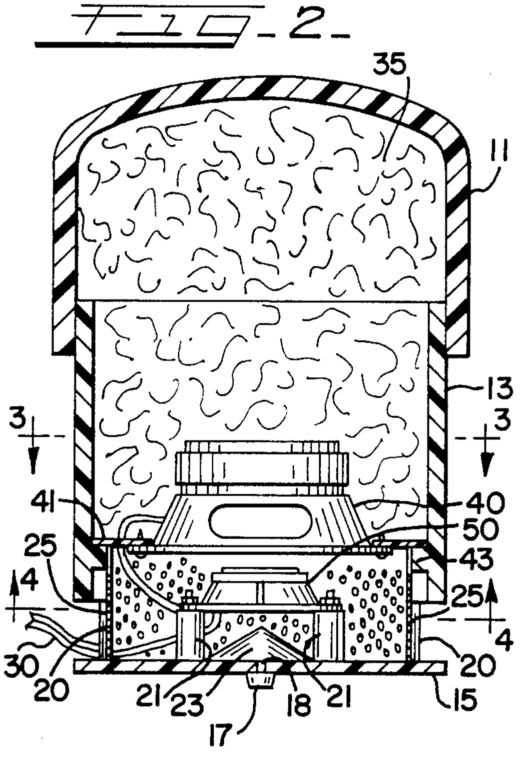
FIG. 2 is a cross-section of the outdoor speaker of FIG. 1.
Figure 4:
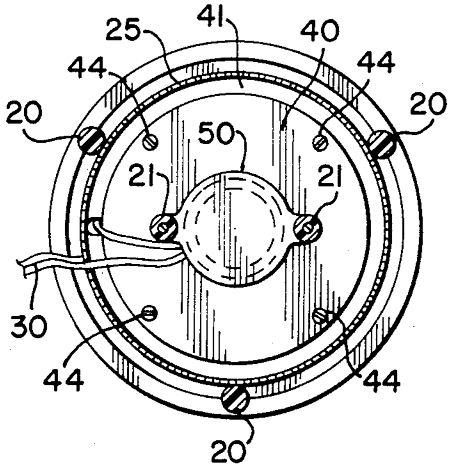
FIG. 4 is a cross-section taken along the lines 4—4 of FIG. 2.

As shown in FIGS. 2 and 4, a smaller cone speaker 50 known as a tweeter is mounted between the woofer speaker 40 and the base 15. The tweeter 50 is mounted coaxially with the woofer speaker 40 for the direction of sound in a downward direction towards the base.

Preferably, the tweeter 50 is mounted approximately one inch above the base on two support posts 21. With a minimum number of such support posts 21, minimal deflection and absorption of sound is achieved. Further, by mounting the tweeter on the base, rather than to the lower housing portion or directly to the woofer or its mountings, assembly is simpler.

A cone 23 may be located beneath and coaxial with tweeter speaker 50. While the cone 23 does improve the quality of the sound coming from the speaker of the subject invention, inclusion of the cone 23 in the speaker is not considered necessary to the invention. By use of such a cone the sound waves propagated out from the tweeter speaker 50 will be more likely to pass through the opening defined by screen 25.

Sound absorbing material 35 is located within the hollow cavity above the woofer speaker thereby suppressing any standing and reflected waves, and greatly improving the frequency response characteristics of the speaker assembly.

Speaker wires 30 are connected to both speakers and to an outside signal source (not shown), such as a amplifier or receiver through opening 18 in base 15 for providing the appropriate signal to and driving the respective speakers. A bypass filter and/or a capacitor may be used to connect the woofer speaker with the tweeter speaker as desired.

With a speaker such as described above and shown in the drawings, a speaker for use outdoors is shown. The speaker of the subject invention is relatively impervious to moisture, its electronic components, i.e., speaker cones, being protected and covered from above by the housing, and spaced from the base below. Its sound reproduction capabilities is omnidirectional without any undue emphasis on bass or treble, due to the downwardly directed and coaxial speakers in combination with the sound absorbent material above the woofer within the housing. As a result, location and orientation of the speaker assembly is not critical to a full enjoyment of the sound emanating therefrom.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A speaker assembly for use outdoors, including a housing, at least two speaker cones, and a base, said housing being impervious to moisture and generally resistant to the effects of weather, said housing being secured in spaced relationship to a base, said base and said housing thereby defining a circumferential aperture for the passage of sound, said speaker cones including a woofer speaker and a tweeter;

said woofer speaker mounted in the lower end of said housing thereby forming an internal chamber below said woofer speaker and between said housing and said base, said woofer speaker being positioned for the downward projection of sound;

said tweeter secured to said base coaxial and in close juxtaposition with said woofer speaker and positioned for the downward projection of sound through said internal chamber and out said circumferential apperture;

whereby sound from said woofer speaker and said tweeter emanates from said speaker assembly in an omnidirectional manner and free from distortion.

2. The speaker assembly of claim 1 wherein said peripheral aperture is enclosed by a screen to hinder to entry of water while permitting the relatively unrestricted passage of sound.

3. The speaker assembly of claim 1 wherein said base includes a cone facing upwardly and coaxial with said speakers for the efficient projection of sound through said aperture.

4. The speaker assembly of claim 1 wherein said tweeter is mounted at least one inch from said base and said woofer speaker is mounted at least two inches from said base.

5. the speaker assembly of claim 1 wherein a closed cavity is formed above said woofer speaker.

6. The speaker assembly of claim 2 wherein said screen comprises a perforated plastic sheet.

7. The speaker assembly of claim 2 wherein said screen is formed from Acrylonitrile-Butadiene-Styrene Copolymer.

* * * * *